(12) United States Patent
Wang et al.

(10) Patent No.: US 8,319,258 B2
(45) Date of Patent: Nov. 27, 2012

(54) ELECTRO-STATIC DISCHARGE (ESD) CLAMPING DEVICE

(75) Inventors: Chang-Tzu Wang, Taipei (TW); Tien-Hao Tang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 336 days.

(21) Appl. No.: 12/704,065

(22) Filed: Feb. 11, 2010

(65) Prior Publication Data

US 2011/0193170 A1  Aug. 11, 2011

(51) Int. Cl.
*H01L 27/118* (2006.01)
(52) U.S. Cl. .......................... 257/204; 361/56
(58) Field of Classification Search ................... 257/204, 257/355
See application file for complete search history.

(56) References Cited

U.S. PATENT DOCUMENTS

| | | | |
|---|---|---|---|
| 4,989,057 A | | 1/1991 | Lu |
| 5,283,449 A | * | 2/1994 | Ooka ............................ 257/204 |
| 5,610,790 A | | 3/1997 | Staab et al. |
| 5,918,127 A | | 6/1999 | Lee et al. |
| 6,097,066 A | * | 8/2000 | Lee et al. ....................... 257/355 |
| 6,114,226 A | | 9/2000 | Change et al. |
| 6,815,775 B2 | * | 11/2004 | Ker et al. ....................... 257/355 |
| 7,098,510 B2 | | 8/2006 | Kodama et al. |
| 7,217,966 B1 | * | 5/2007 | Vashchenko et al. .......... 257/210 |
| 7,279,727 B2 | * | 10/2007 | Ikoma et al. ................... 257/204 |
| 7,402,846 B2 | * | 7/2008 | Schwantes et al. ............ 257/202 |
| RE43,215 E | * | 2/2012 | Ker et al. ........................ 257/355 |
| 2001/0025968 A1 | * | 10/2001 | Osanai ........................... 257/204 |
| 2002/0030238 A1 | * | 3/2002 | Nakamura et al. ............. 257/409 |
| 2002/0149059 A1 | * | 10/2002 | Ker et al. ........................ 257/355 |
| 2009/0294856 A1 | * | 12/2009 | Chen .............................. 257/357 |

OTHER PUBLICATIONS

Chang, Hun-Hsien "Design of dynamic-floating-gate technique for output ESD protection in deep-submicron CMOS technology" Solid-State Electronics 43 Jan. 1999 pp. 375-393.*

* cited by examiner

*Primary Examiner* — N Drew Richards
*Assistant Examiner* — Grant Withers
(74) *Attorney, Agent, or Firm* — Chun-Ming Shih

(57) ABSTRACT

An ESD clamping device comprises a plurality of fingers each comprising a source region of first conductivity type formed in a substrate of second conductivity type, a drain region of said first conductivity type formed in the substrate, and a gate formed over the substrate and between the source and drain regions. At least one of the fingers each has an ESD implantation region formed in the substrate and partially underlying the drain region of the finger, the ESD implantation region being a heavily doped region of said second conductivity type. Furthermore, at least one of the fingers has a gate extension portion projecting from the gate and demarcating an additional region in at least the drain region of the finger, the additional region of said second conductivity type being electrically connected to at least one of the gate and the substrate of each of the fingers.

17 Claims, 13 Drawing Sheets

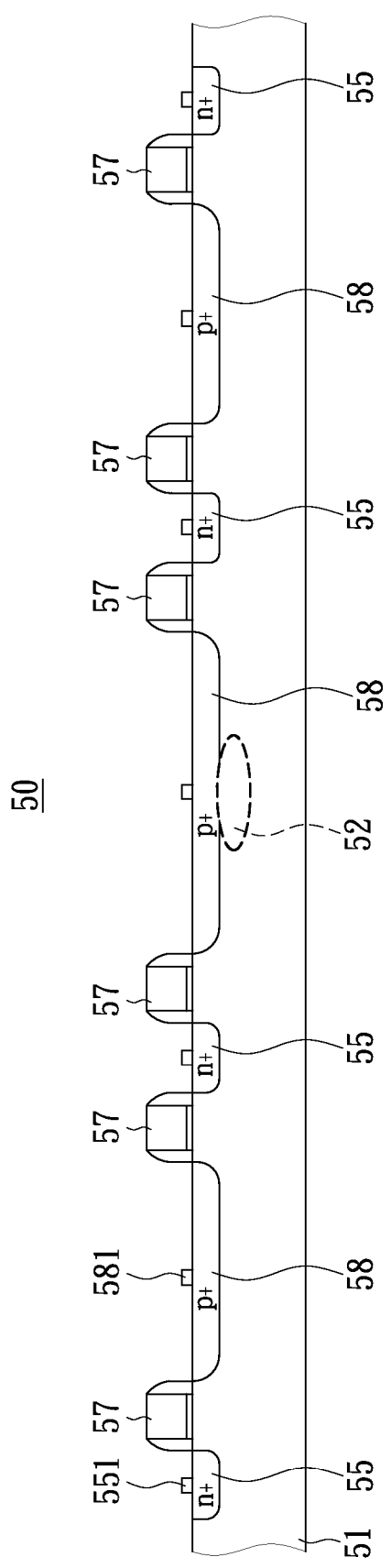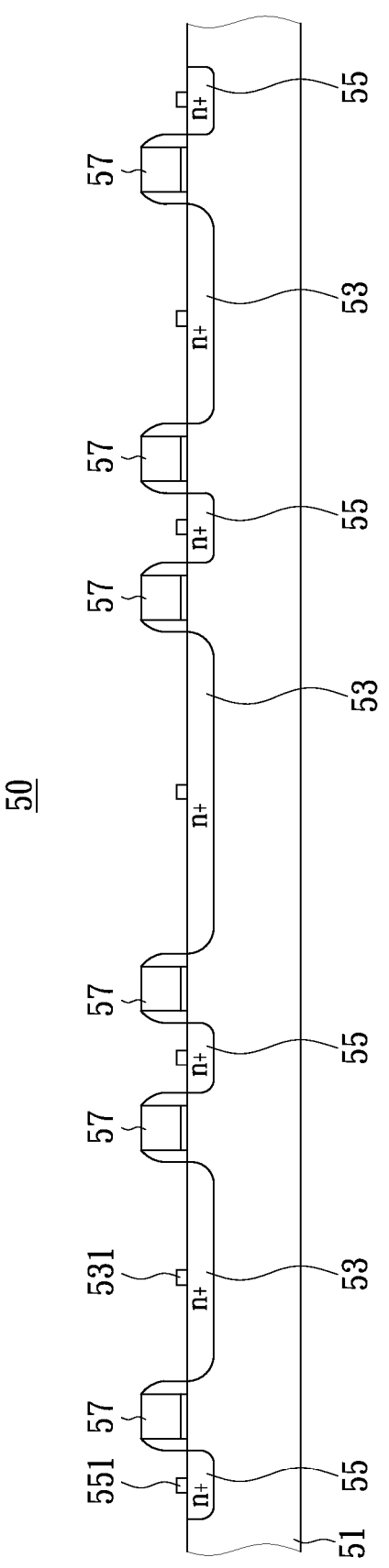
FIG. 5A
FIG. 5B

ELECTRO-STATIC DISCHARGE (ESD) CLAMPING DEVICE

BACKGROUND

1. Technical Field

The present invention generally relates to the art of semiconductor devices and, particularly to a high efficient electrostatic discharge (ESD) clamping device.

2. Description of the Related Art

ESD is a continuing problem in the design and manufacture of semiconductor devices. Integrated circuits (ICs) can be damaged by ESD events stemming from a variety of sources, in which large currents flow through the device. In one such ESD event, a packaged IC receives a charge when it is held by a human whose body is electro-statically charged. This type of event is known as a human body mode (HBM) ESD stress. For example, a charge of about 0.6 μC can be induced on a body capacitance of 150 pF, leading to electro-static potentials of 4 kV or greater. HBM ESD events can result in a discharge for about 100 nS with peak currents of several amperes to the IC. Another source of ESD is from metallic objects, known as the machine mode (MM) ESD source, which is characterized by a greater capacitance and lower internal resistance than the HBM ESD source. The MM ESD can result in ESD transients with significantly higher rise times than the HBM ESD source. A third ESD mode is the charged device model (CDM), which involves situations where an IC becomes charged and discharges to ground when the IC is inserted into a socket, and one or more of the pins of the IC package touch the grounded contacts of the socket. In this model, the ESD discharge current flows in the opposite direction in the IC than that of the HBM ESD source and the MM ESD source. CDM pulses also typically have very fast rise times compared to the HBM ESD source.

So far, many ESD clamping device (a kind of ESD protection devices) designs have been proposed for protecting ICs for ESD. One common technique for creating ESD clamping devices for protection of ICs is to create n-channel MOS (nMOS) devices, in each of which a parasitic bipolar transistor (e.g., a lateral NPN) associated with the nMOS device turns on to conduct ESD currents from the pad to ground. In order to enhance the ESD robustness of these clamping devices, some ESD implantations had been reported for inclusion into the manufacture process to modify device structures for ESD protection. Generally, an n-type ESD implantation is used to cover the lightly-doped drain (LDD) peak structure and make a deeper junction in nMOS devices for ESD protection. A p-type ESD implantation wholly underlying the drain region of the nMOS device is used to reduce a reverse junction breakdown voltage and allow earlier turn-on/activation of a parasitic lateral bipolar transistor in the NMOS device for ESD protection. In short, both of the n-type and p-type ESD implantations are selectively used in nMOS devices according to requirement of actual applications to yield a higher ESD robustness.

However, owning to the p-type ESD implantation, the reverse junction breakdown voltage of the nMOS device will be reduced to 6V~7V. For a 5V application of normal operation, the reverse junction breakdown voltage is close to its operating voltage. Therefore, a leakage current of such nMOS device during a normal operation (i.e., in the situation of no ESD event occur) is excessively large, such leakage current cannot be tolerable when such nMOS device is applied for low leakage applications or products. Accordingly, how to minimize the large leakage current during the normal operation and/or keep the advantage of high turn-on efficiency is very important, so that the clamping devices could achieve higher efficiency for ESD protection.

BRIEF SUMMARY

In order to address the issues associated with the prior art, the present invention is directed to an ESD clamping device having higher efficiency for ESD protection.

More specifically, an ESD clamping device in accordance with an embodiment of the present invention comprises a plurality of fingers. Each of the fingers comprises: a source region of first conductivity type formed in a substrate of second conductivity type, a drain region of said first conductivity type formed in the substrate, and a gate formed over the substrate and between the source and drain regions. Moreover, at least one of the fingers has an ESD implantation region formed in the substrate and partially underlying (i.e., directly underlying a part of rather than an entirety of) the drain region of the finger, the ESD implantation region being a heavily doped region of said second conductivity type.

In one embodiment, the ESD implantation region is formed directly underlying a central part of the drain region.

In one embodiment, the finger having the ESD implantation region formed in the substrate thereof is a central one of the fingers.

In one embodiment, the gates of adjacent two of the fingers having a common drain region are connected with each other and thereby cooperatively constitute a closed structure, e.g., rectangle structure.

In one embodiment, at least one of the fingers has a gate extension portion projecting from the gate and demarcating an additional region in at least the drain region of the finger, the additional region being a heavily doped region of said second conductivity type and electrically connected to at least one of the gate and the substrate of each of the fingers.

In one embodiment, the finger having the additional region is a central one of the fingers.

In one embodiment, each of the fingers has one the additional region formed in at least the drain region thereof and electrically connected to the substrate thereof, the additional regions of all the fingers are electrically connected with each other. Optionally, the additional regions of all the fingers are further electrically connected to the gates of all the fingers.

In one embodiment, the gate extension portions of adjacent two of the fingers having a common source region are connected with each other and whereby the common source region is blocked/interrupted off.

In one embodiment, the gate extension portions of adjacent two of the fingers having a common drain region are connected with each other and whereby the common drain region is blocked off.

An ESD clamping device in accordance with another embodiment of the present invention comprises a plurality of fingers. Each of the fingers comprises a source region, a drain region having a same conductivity type with respect to the source region, and a gate structure formed over and between the source and drain regions. A designated one (e.g., a central one) of the fingers has an ESD implantation region formed directly underlying a part of (e.g., a central part of) rather than an entirety of the drain region thereof, the ESD implantation region having an opposite conductivity type with respect the drain region. Moreover, the designated one of the fingers can further have an addition region formed between the source and drain regions and surrounded by the gate structure thereof.

In one embodiment, each of the remained fingers has one the additional region formed between the source and drain regions and surrounded by the gate structure thereof, and the additional regions of all the fingers are electrically connected with each other.

An ESD clamping device in accordance with still another embodiment of the present invention comprises a plurality of finger pairs. Each of the finger pairs comprises: two source/drain regions of first conductivity type formed in a substrate of second conductivity type, a common drain/source region of said first conductivity type formed in the substrate and between the two source/drain regions, and a gate structure formed over the substrate and separating the two source/drain regions from the common drain/source region. A designated one (e.g., a central one) of the finger pairs has an ESD implantation region and an additional region both formed in the substrate, the ESD implantation region is a heavily doped region of said second conductivity type, the additional region being another heavily doped region of said second conductivity type and surrounded by the gate structure.

In one embodiment, the gate structure of the designated finger pair is a continuous poly-gate structure, e.g., a rectangle structure.

In one embodiment, the designated finger pair is a central one of the finger pairs.

In summary, in the above-mentioned embodiments of the present invention, a size-reduced ESD implantation region is employed in the ESD clamping device, so that a total leakage current during a normal operation (i.e., generally standby leakage current) of the ESD clamping device can be effectively minimized. Furthermore, due to the formation of the additional region(s) in one of or all of the fingers and thereby at least one ESD gated diode is formed, the ESD gated diode can be turned on at first during ESD events and then provide some driving current that can be applied for the gates and/or the substrates of the fingers for early triggering on. Accordingly, the present invention proposes an excellent solution for the advantage of low leakage current and/or high turn-on efficiency. Such solution is quite useful for low leakage current applications or products.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 5A is a schematic cross-sectional view of the ESD clamping device taken along the line A5-A5' in FIG. 5

FIG. 5B is a schematic cross-sectional view of the ESD clamping device taken along the line B5-B5' in FIG. 5.

DETAILED DESCRIPTION

Figure 1:
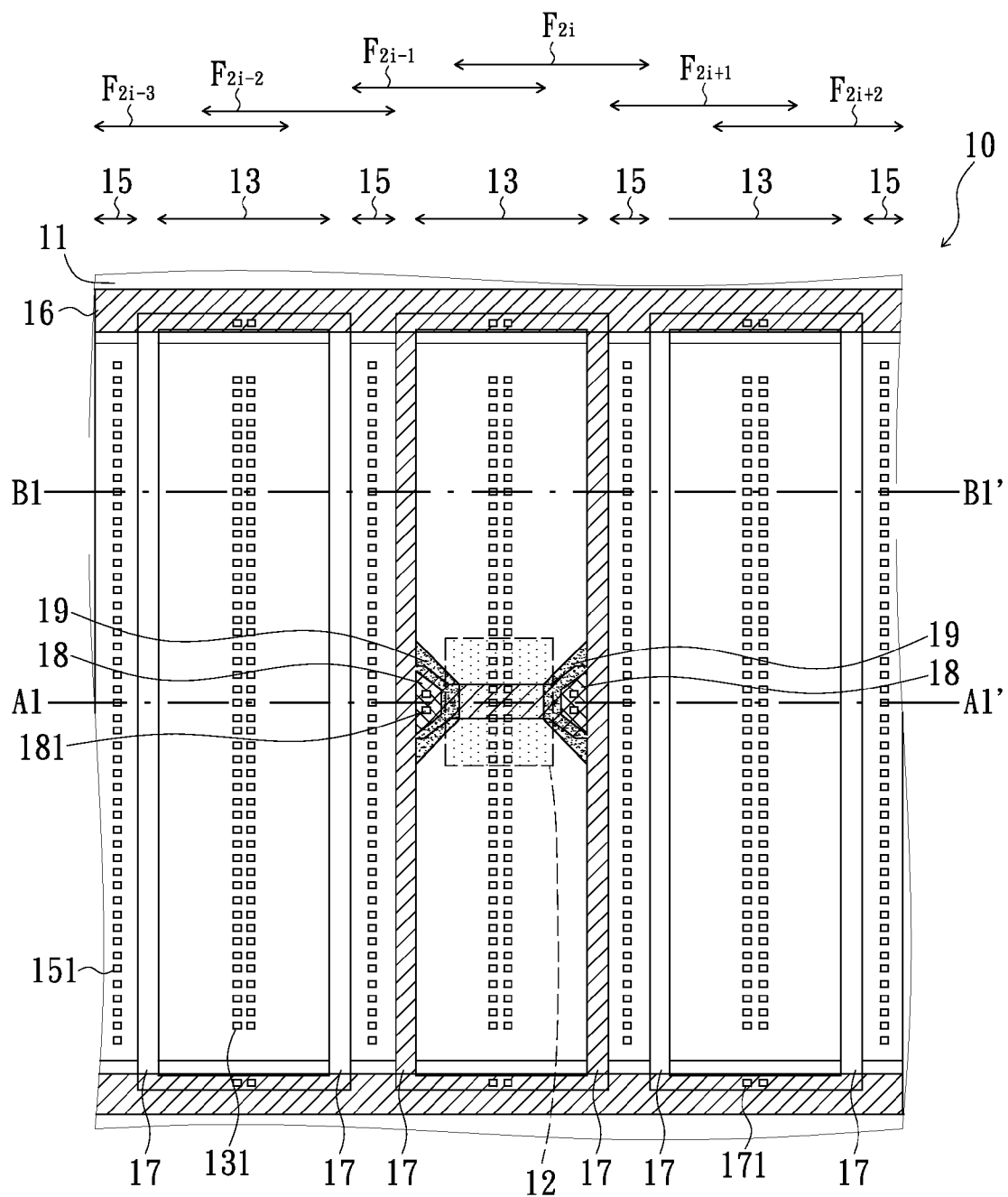
FIG. 1 is a partial schematic layout top view of an ESD clamping device in accordance with a first embodiment of the present invention.

A better understanding of the above and many other features and advantages of the novel ESD clamping device of the present invention may be obtained from a consideration of the detailed description of some exemplary embodiments thereof below, particularly if such consideration is made in conjunction with the appended drawings, wherein like reference numerals are used to identify like elements illustrated in one or more of the figures thereof.

First Embodiment

Figure 1A:
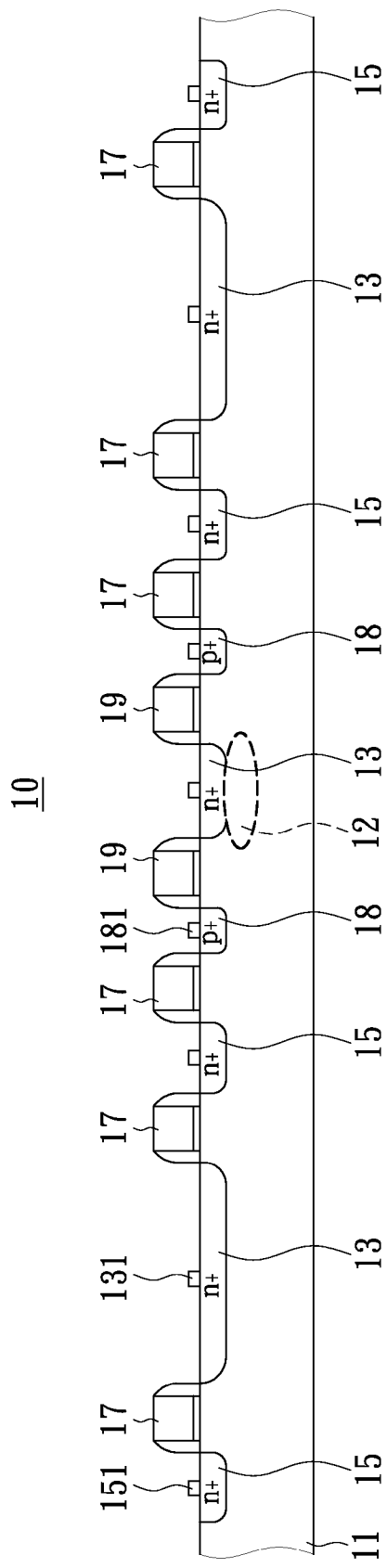
FIG. 1A is a schematic cross-sectional view of the ESD clamping device taken along the line A1-A1' in FIG. 1
Figure 1B:
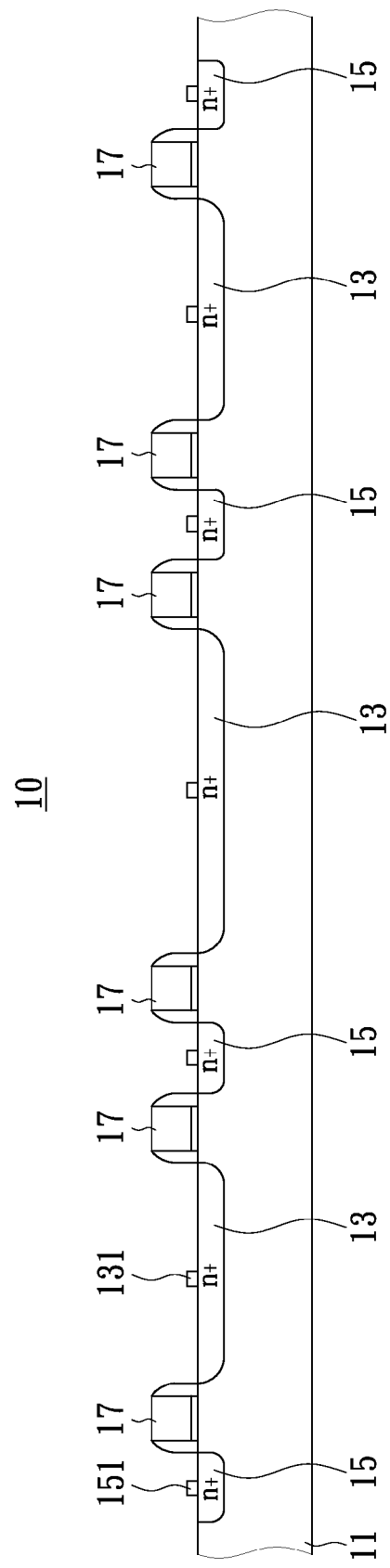
FIG. 1B is a schematic cross-sectional view of the ESD clamping device taken along the line B1-B1' in FIG. 1.
Figure 1C:
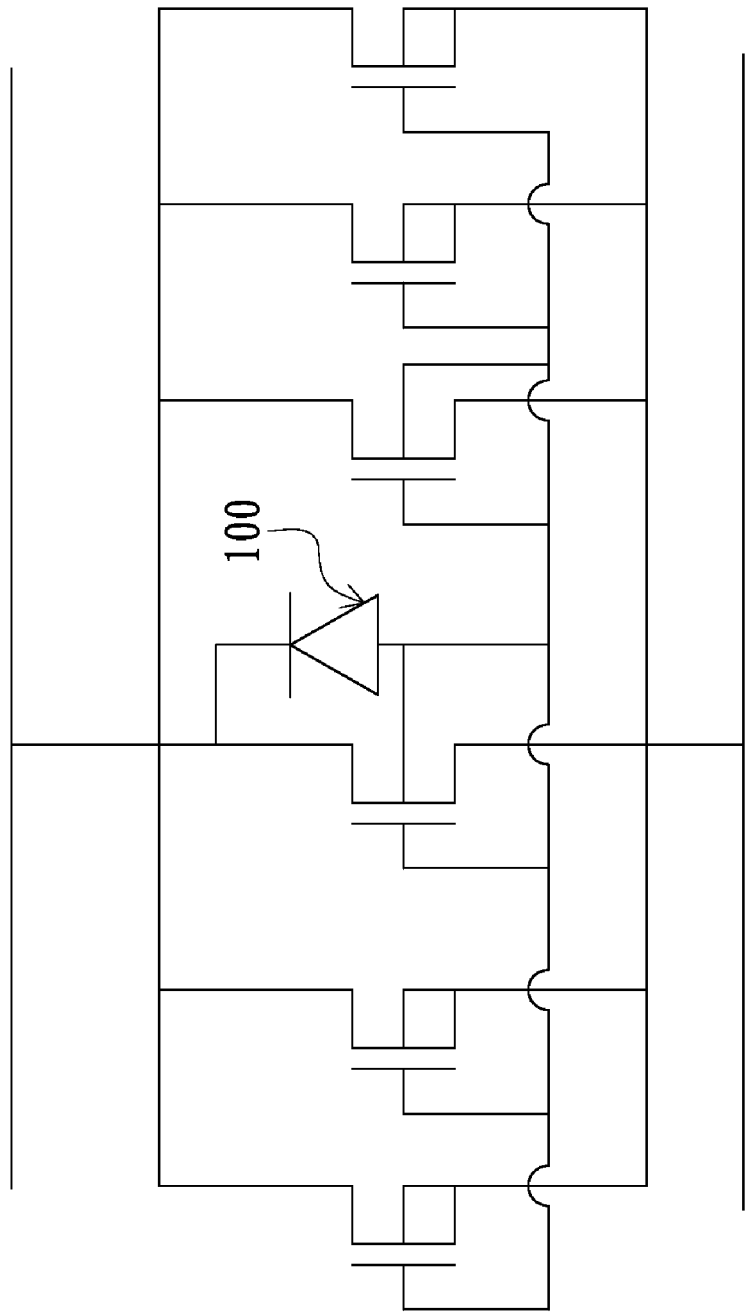
FIG. 1C is an equivalent circuit diagram of the ESD clamping device in FIG. 1.

Referring to FIGS. 1, 1A, 1B and 1C, FIG. 1 showing a partial schematic layout top view of an ESD clamping device in accordance with a first embodiment of the present invention, FIG. 1A showing a schematic cross-sectional view of the ESD clamping device taken along the line A1-A1' in FIG. 1, FIG. 1B showing another schematic cross-sectional view of the ESD clamping device taken along the line B1-B1' in FIG. 1, FIG. 1C showing an equivalent circuit diagram of the ESD clamping device in FIG. 1.

As illustrated in FIGS. 1, 1A and 1B, the ESD clamping device 10 comprises a substrate 11 and a plurality of fingers $F_j$ (j is for example 2i−3, 2i−2, 2i−1, 2i, 2i+1 and 2i+2, where i is a positive integer). In the first embodiment, the substrate 11 is a p-type substrate for the purpose of illustration and comprises a plurality of portions (e.g., p-type wells in the substrate 11, not labeled) for the formation of the fingers $F_j$, hereinafter such portions are termed as finger-substrates for the convenience of description. Moreover, it is indicated that the amount of the fingers $F_j$ is not limited to be six as illustrated in FIG. 1, which can be determined according to requirement of actual applications.

In particular, each of the fingers $F_j$ comprises a drain region 13, a source region 15 and a gate 17. The drain region 13 is formed in the p-type finger-substrate, the conductivity type of the drain region 13 is an n-type for the purpose of illustration and generally is a heavily doped $n^+$ region, the drain region 13 further has a plurality of contacts 131 arrayed in rows and formed at a central portion thereof. The source region 15 is formed mutually adjacent with the drain region 13 and in the same p-type finger-substrate with the drain region 13, the conductivity type of the source region 15 is an n-type for the purpose of illustration and generally is a heavily doped $n^+$ region, the source region 15 further has a plurality of contacts 151 arrayed in one row and formed at a central portion thereof. The gate 17 is formed over the p-type finger-substrate and between the drain region 13 and the source region 15, the gate 17 generally is made of poly-silicon and thus also is called as poly-gate, the gate 17 further has a plurality of contacts 171 formed thereon and electrically contacted therewith. Generally, a channel region (e.g., n-type channel region, not labeled) is formed between the drain region 13 and the source region 15, and the gate 17 is formed over the channel region. As seen from FIG. 1, the drain regions 13 and the source regions 15 of the fingers $F_j$ are arrayed in alternating fashion, the gates 17 of mutually adjacent two of the fingers $F_j$ (e.g. finger pair $F_{2i-3}$, $F_{2i-2}$, or finger pair $F_{2i-1}$, $F_{2i}$) having a common drain region 13 are connected with each other and thereby cooperatively constitute a closed structure, e.g., rectangle structure as illustrated in FIG. 1. Herein, mutually adjacent two of the fingers $F_j$ having a common drain region 13 are called as one finger pair; in another embodiment, mutually adjacent two of the fingers $F_j$ (e.g., $F_{2i-2}$ and $F_{2i-1}$) having a common source region 15 also can be called as one finger pair.

In addition, in one aspect, central fingers $F_{2i-1}$ and $F_{2i}$ each comprise a gate extension portion 19 projecting from the gate 17 and demarcating an additional region 18 in the drain region 13, herein the central fingers $F_{2i-1}$ and $F_{2i}$ cooperatively constitute a central finger pair. The gate extension portion 19 generally is made of poly-silicon and constitutes a gate structure cooperatively with the gate 17, the gate structures of the central finger pair $F_{2i-1}$, $F_{2i}$ are connected with each other and thereby form a continuous poly-gate structure, but it is not to limit to the present invention and can be a discontinuous poly-gate structure instead. The additional region 18 of each of the central fingers $F_{2i-1}$ and $F_{2i}$ is formed in the finger-substrate to electrically connect therewith and is a heavily doped p$^+$ region for the purpose of illustration. The additional region 18 is surrounded/enclosed by the gate structure. Moreover, the additional region 18 of each of the central fingers $F_{2i-1}$ and $F_{2i}$ has a plurality of contacts 181 formed electrically contacting therewith and is electrically connected to the gates 17 of all the fingers $F_j$ through a metal layer 16. In another aspect, an ESD implantation region 12 is formed in the finger-substrate and directly underlying a part of rather than an entirety of the common drain region 13 of the central fingers $F_{2i-1}$ and $F_{2i}$. The ESD implantation is a heavily doped p$^+$ region for the purpose of illustration. As illustrated in FIG. 1, the ESD implantation region 12 is formed directly underlying a central part of the common drain region 13 of the central fingers $F_{2i-1}$ and $F_{2i}$. That is, the ESD implantation region 12 has a dimension smaller than that of the common drain region 13 of the central fingers $F_{2i-1}$ and $F_{2i}$.

In the first embodiment, the common n$^+$ drain region 13 and the two p$^+$ additional regions 18 of the central fingers $F_{2i-1}$ and $F_{2i}$ and the p$^+$ ESD implantation region 12 cooperatively constitute an ESD gated diode 100. It is indicated that when only one of the central fingers $F_{2i-1}$ and $F_{2i}$ have the p$^+$ additional region 18, the ESD gated diode 100 would have only one P$^+$ additional region 18 instead. As illustrated in FIG. 1C, the six n-type metal-oxide semiconductor (nMOS) transistors are corresponding to the six fingers $F_j$ in FIG. 1. The drain electrodes of all the nMOS transistors are electrically connected to each other together, the source electrodes of all the nMOS transistors also are electrically connected to each other together. A positive electrode of the ESD gated diode 100 is electrically connected to the gates of all the nMOS transistors and the substrates (corresponding to finger-substrates) of the two central nMOS transistors (corresponding to the central fingers $F_{2i-1}$ and $F_{2i}$), a negative electrode of the ESD gated diode 100 is electrically connected to the drain electrodes of all the nMOS transistors. Herein, since the common n$^+$ drain region 13 and the p$^+$ ESD implantation region 18 generally contribute to most leakage current during a normal operation (i.e., in the situation of no ESD event occur) of the ESD clamping device 10, therefore the minimum ESD implantation region 18 associated with the first embodiment facilitates the achievement of reduced total leakage current during the normal operation (i.e., generally standby leakage current). When an ESD event occurs, the ESD gated diode 100 will be turned on at first and then provide some driving current to the gates 17 of all the fingers $F_j$ and some finger-substrates of the fingers to trigger each of the fingers $F_j$ for ESD protection, so that the turn-on efficiency is increased and thus the robustness of the ESD clamping device 10 is greatly improved.

Second Embodiment

Figure 2:
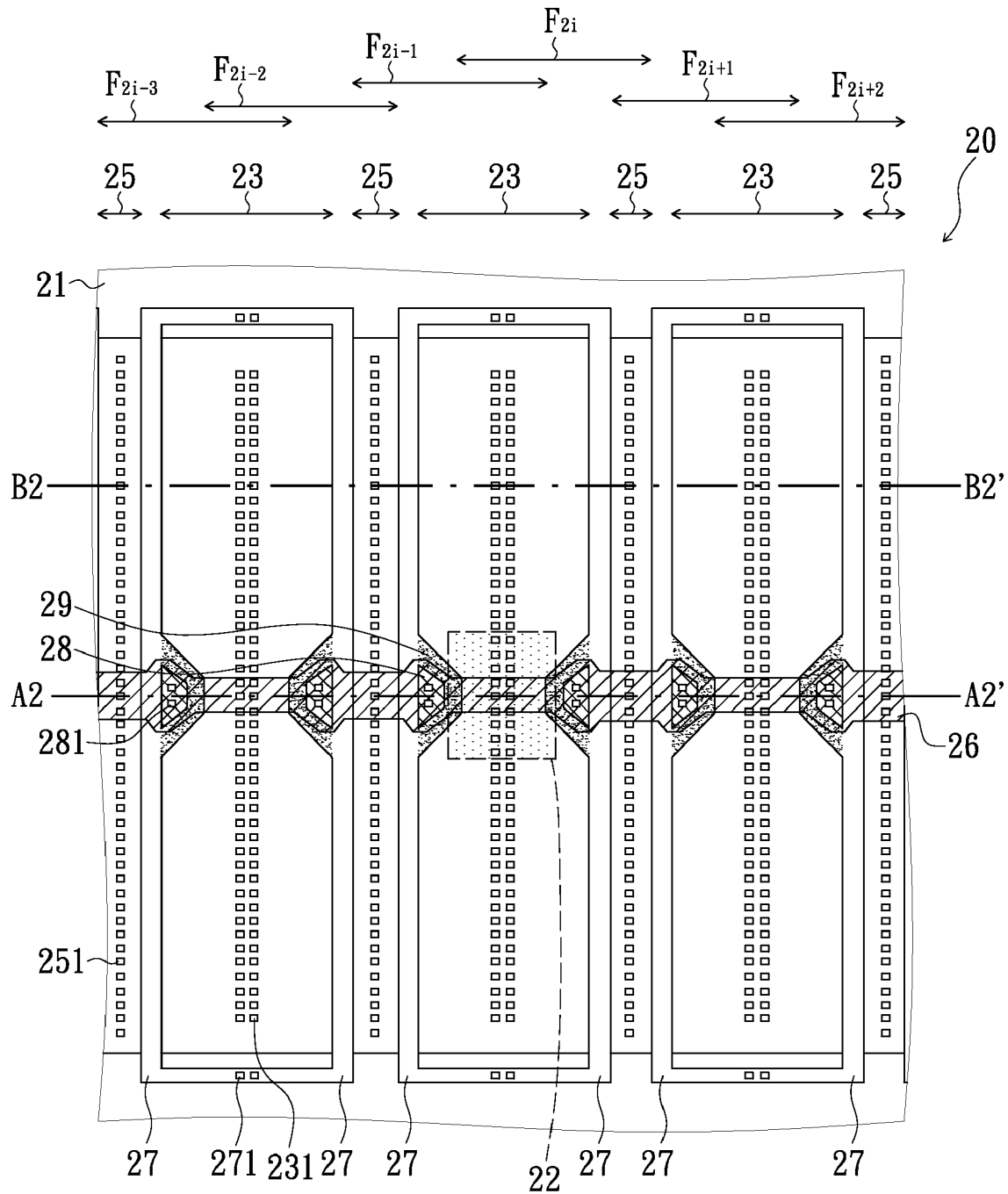
FIG. 2 is a partial schematic layout top view of an ESD clamping device in accordance with a second embodiment of the present invention.
Figure 2A:
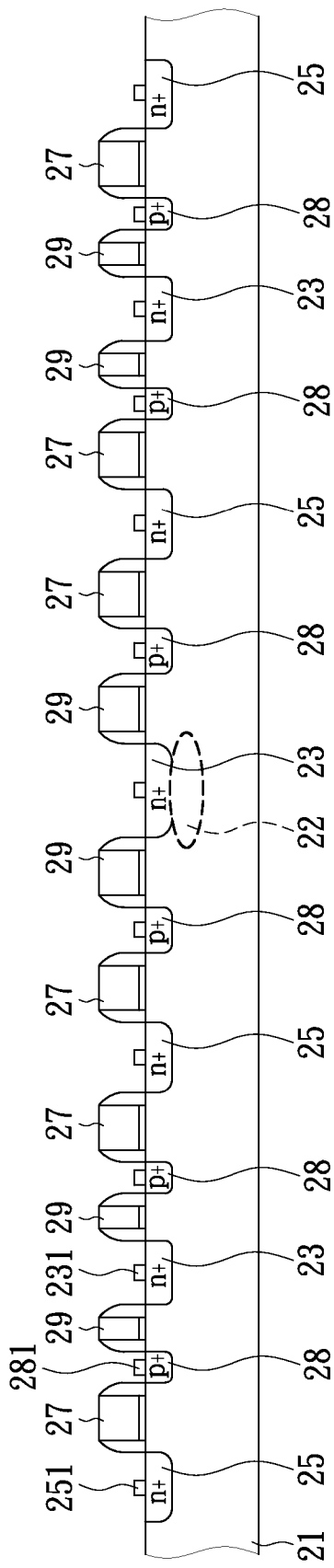
FIG. 2A is a schematic cross-sectional view of the ESD clamping device taken along the line A2-A2' in FIG. 2
Figure 2B:
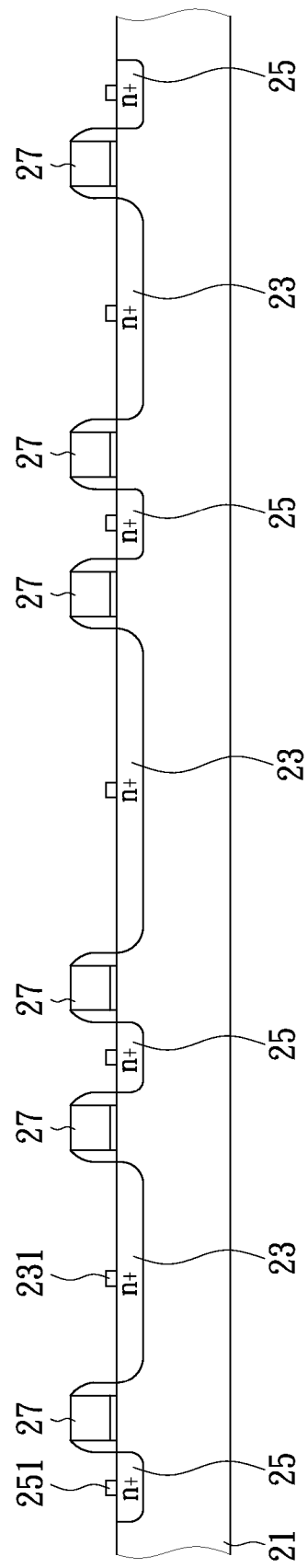
FIG. 2B is a schematic cross-sectional view of the ESD clamping device taken along the line B2-B2' in FIG. 2.
Figure 2C:
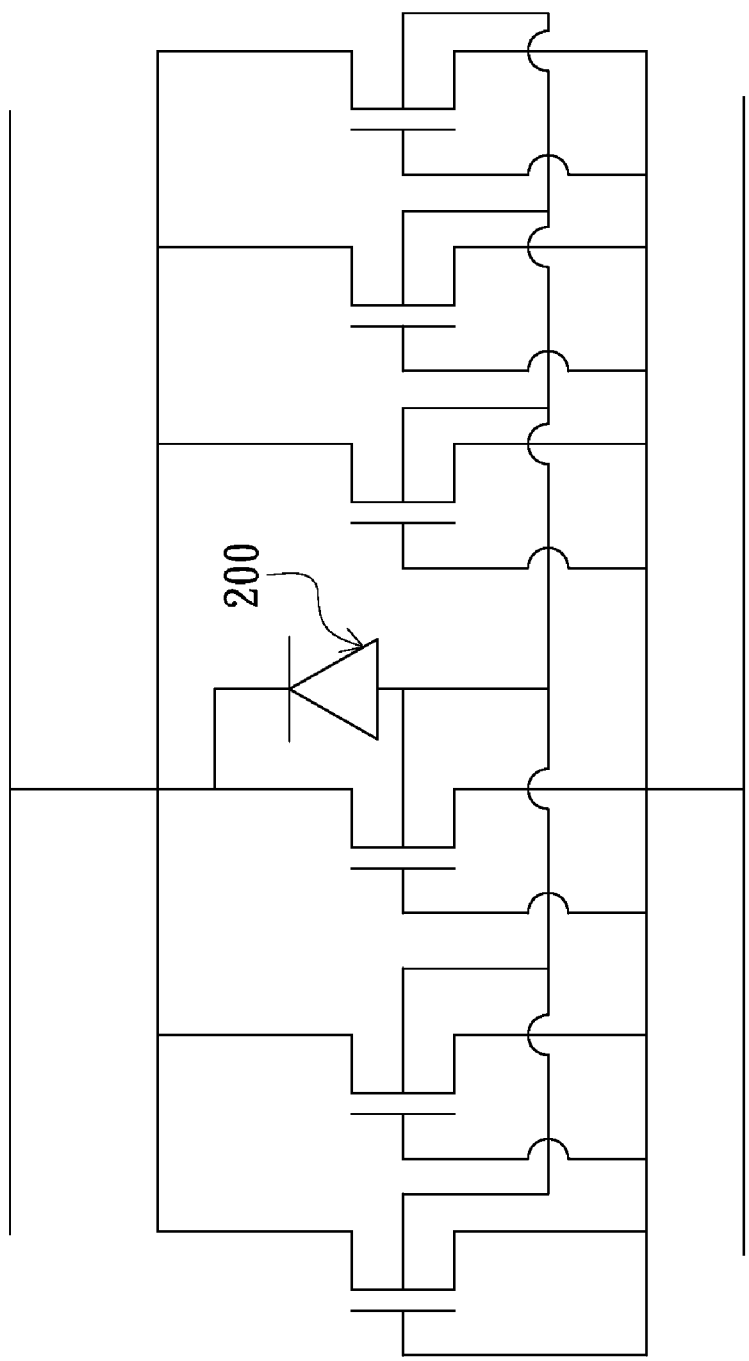
FIG. 2C is an equivalent circuit diagram of the ESD clamping device in FIG. 2.

Referring to FIGS. 2, 2A, 2B and 2C, FIG. 2 showing a partial schematic layout top view of an ESD clamping device in accordance with a second embodiment of the present invention, FIG. 2A showing a schematic cross-sectional view of the ESD clamping device taken along the line A2-A2' in FIG. 2, FIG. 2B showing another schematic cross-sectional view of the ESD clamping device taken along the line B2-B2' in FIG. 2, FIG. 2C showing an equivalent circuit diagram of the ESD clamping device in FIG. 2.

As illustrated in FIGS. 2, 2A and 2B, the ESD clamping device 20 comprises a substrate 21 and a plurality of fingers $F_j$ (j is for example 2i−3, 2i−2, 2i−1, 2i, 2i+1 and 2i+2, where i is a positive integer). In the second embodiment, the substrate 21 is a p-type substrate for the purpose of illustration and comprises a plurality of p-type finger-substrates (not labeled) for the formation of the fingers $F_j$.

In particular, each of the fingers $F_j$ comprises a drain region 23, a source region 25 and a gate 27. The drain region 23 is formed in the p-type finger-substrate, the conductivity type of the drain region 23 is an n-type for the purpose of illustration and generally is a heavily doped n$^+$ region, the drain region 23 further has a plurality of contacts 231 arrayed in rows and formed at a central portion thereof. The source region 25 is formed mutually adjacent with the drain region 23 and in the same p-type finger-substrate with the drain region 23, the conductivity type of the source region 25 is an n-type for the purpose of illustration and generally is a heavily doped n$^+$ region, the source region 25 further has a plurality of contacts 251 arrayed in one row and formed at a central portion thereof. The gate 27 is formed over the p-type finger-substrate and between the drain region 23 and the source region 25, the gate 27 generally is made of poly-silicon and thus also is called as poly-gate, the gate 27 further has a plurality of contacts 271 formed thereon and electrically contacted therewith. As seen from FIG. 2, the drain regions 23 and the source regions 25 of the fingers $F_j$ are arrayed in alternating fashion, the gates 27 of mutually adjacent two of the fingers $F_j$ (e.g., finger pair $F_{2i-3}$, $F_{2i-2}$, or finger pair $F_{2i-1}$, $F_{2i}$) having a common drain region 23 are connected with each other and thereby cooperatively constitute a closed structure, e.g., rectangle structure as illustrated in FIG. 2. Herein, mutually adjacent two of the fingers $F_j$ having a common drain region 23 is called as one finger pair; in another embodiment, mutually adjacent two of the fingers $F_j$ (e.g., $F_{2i-2}$ and $F_{2i-1}$) having a common source region 25 also can be called as one finger pair.

In addition, in one aspect, each of the fingers $F_j$ comprises a gate extension portion 29 projecting from the gate 27 and demarcating an additional region 28 in the drain region 23 of the finger. The gate extension portion 29 generally is made of poly-silicon. The gate 27 and the gate extension portion 29 constitute a gate structure, the gate structures of adjacent two of the fingers $F_j$ having a common drain region 23 are connected with each other and thereby form a continuous poly-gate structure. The additional region 28 is formed in the finger-substrate to electrically connect therewith and is a heavily doped $p^+$ region for the purpose of illustration. The additional region 28 is surrounded by the gate structure. Furthermore, the additional region 28 has a plurality of contacts 281 formed electrically contacting therewith. Herein, the additional regions 28 of all the fingers $F_j$ are electrically connected to each other through a metal layer 26. In another aspect, an ESD implantation region 22 is formed in the finger-substrate and directly underlying a part of rather than an entirety of the common drain region 23 of central fingers $F_{2i-1}$ and $F_{2i}$, herein the central fingers $F_{2i-1}$ and $F_{2i}$ constitute a central finger pair. The ESD implantation is a heavily doped $p^+$ region for the purpose of illustration and thus has an opposite conductivity type with respect to the common drain region 23. As illustrated in FIG. 2, the ESD implantation region 22 is formed directly underlying a central part of the common drain region 23 of the central fingers $F_{2i-1}$ and $F_{2i}$. That is, the ESD implantation region 22 has a dimension smaller than that of the common drain region 23 of the central fingers $F_{2i-1}$ and $F_{2i}$.

In the second embodiment, the common $n^+$ drain region 23 and the two $p^+$ additional regions 28 of the central fingers $F_{2i-1}$ and $F_{2i}$ and the $p^+$ ESD implantation region 22 cooperatively constitute an ESD gated diode 200. It is indicated that when only one of the central fingers $F_{2i-1}$ and $F_{2i}$ have the $p^+$ additional region 28, the ESD gated diode 200 would have only one $P^+$ additional region 28 instead. As illustrated in FIG. 2C, the six nMOS transistors are corresponding to the six fingers $F_j$ in FIG. 2. The drain electrodes of all the nMOS transistors are electrically connected to each other together, the source electrodes of all the nMOS transistors also are electrically connected to each other together. A positive electrode of the ESD gated diode 200 is electrically connected to the substrates of all the nMOS transistors due to the connection of the metal layer 26, a negative electrode of the embedded ESD gated diode 200 is electrically connected to the drain electrodes of all the nMOS transistors. Herein, since the common $n^+$ drain region 23 and the $p^+$ ESD implantation region 28 generally contribute to most leakage current during a normal operation of the ESD clamping device 20, therefore the minimum ESD implantation region 28 associated with the second embodiment facilitates the achievement of reduced total leakage current during the normal operation. Furthermore, when an ESD event occurs, the ESD gated diode 200 will be turned on at first and then provide some driving current to trigger the finger-substrates of all the fingers $F_j$ for ESD protection, so that the turn-on efficiency is increased and thus the robustness of the ESD clamping device 20 is greatly improved.

Third Embodiment

Figure 3:
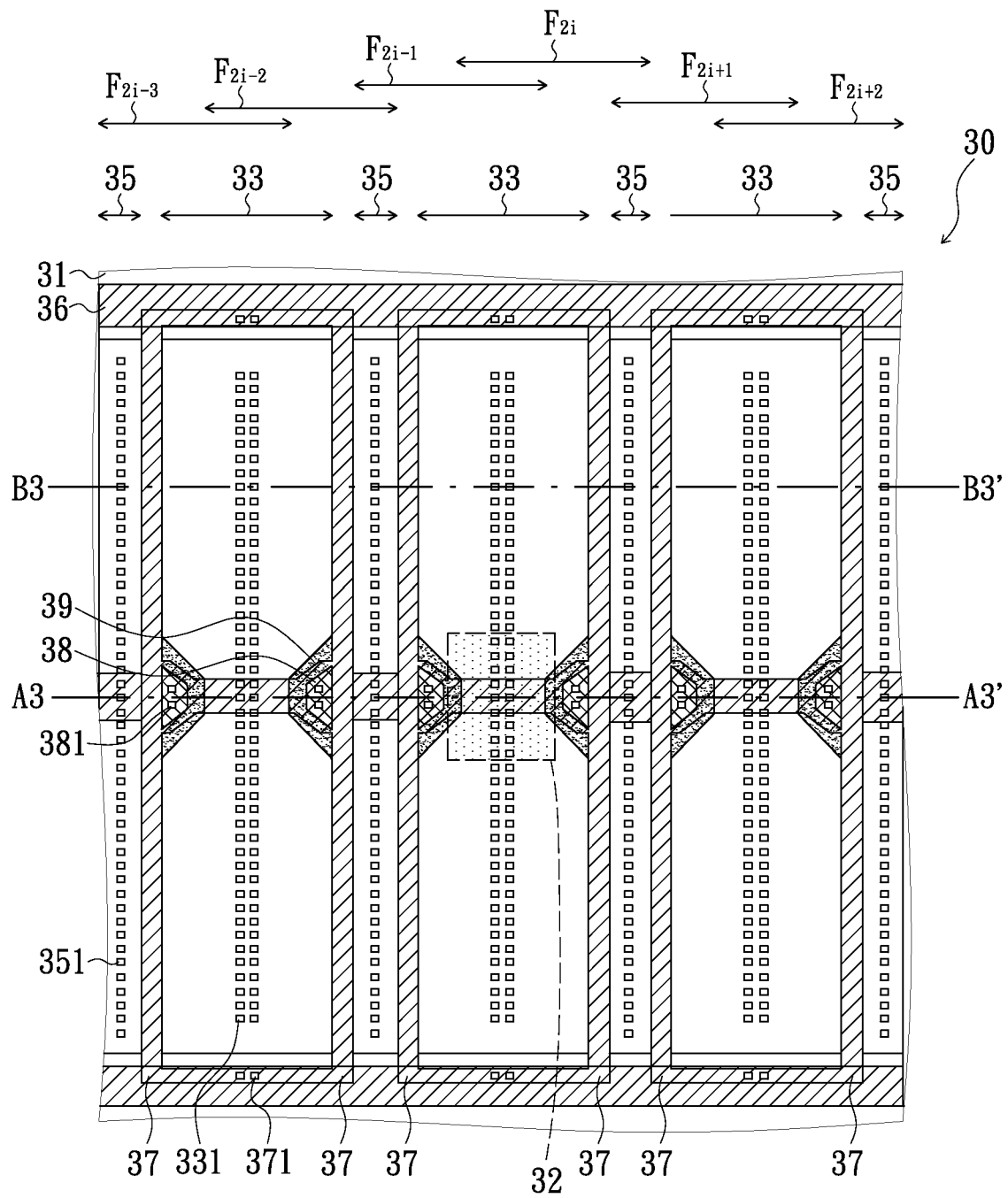
FIG. 3 is a partial schematic layout top view of an ESD clamping device in accordance with a third embodiment of the present invention.
Figure 3A:
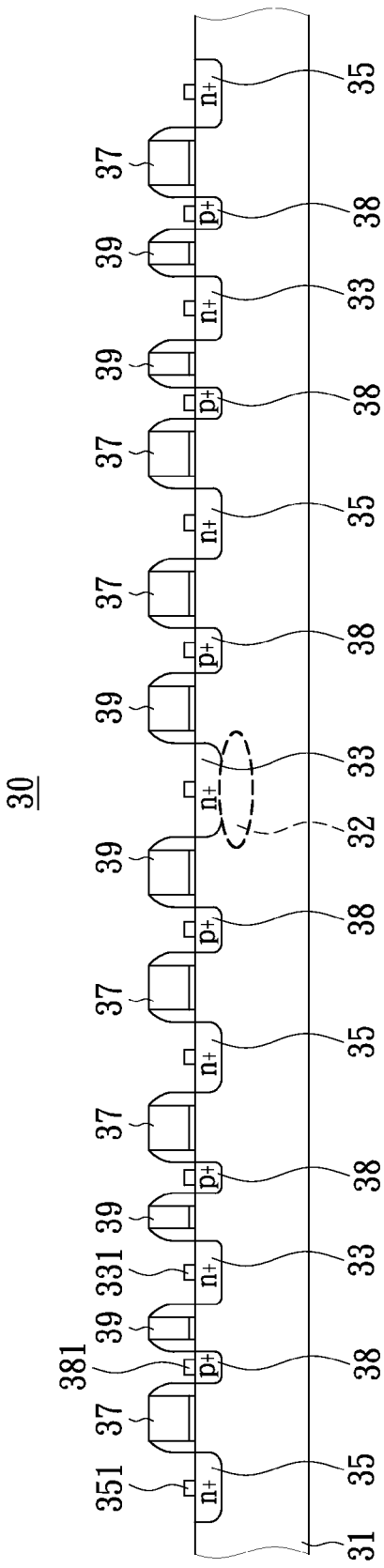
FIG. 3A is a schematic cross-sectional view of the ESD clamping device taken along the line A3-A3' in FIG. 3
Figure 3B:
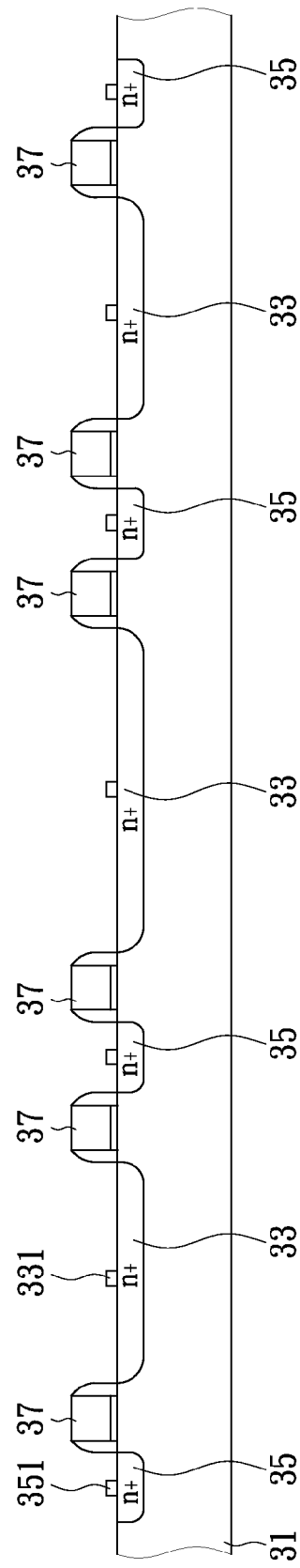
FIG. 3B is a schematic cross-sectional view of the ESD clamping device taken along the line B3-B3' in FIG. 3.
Figure 3C:
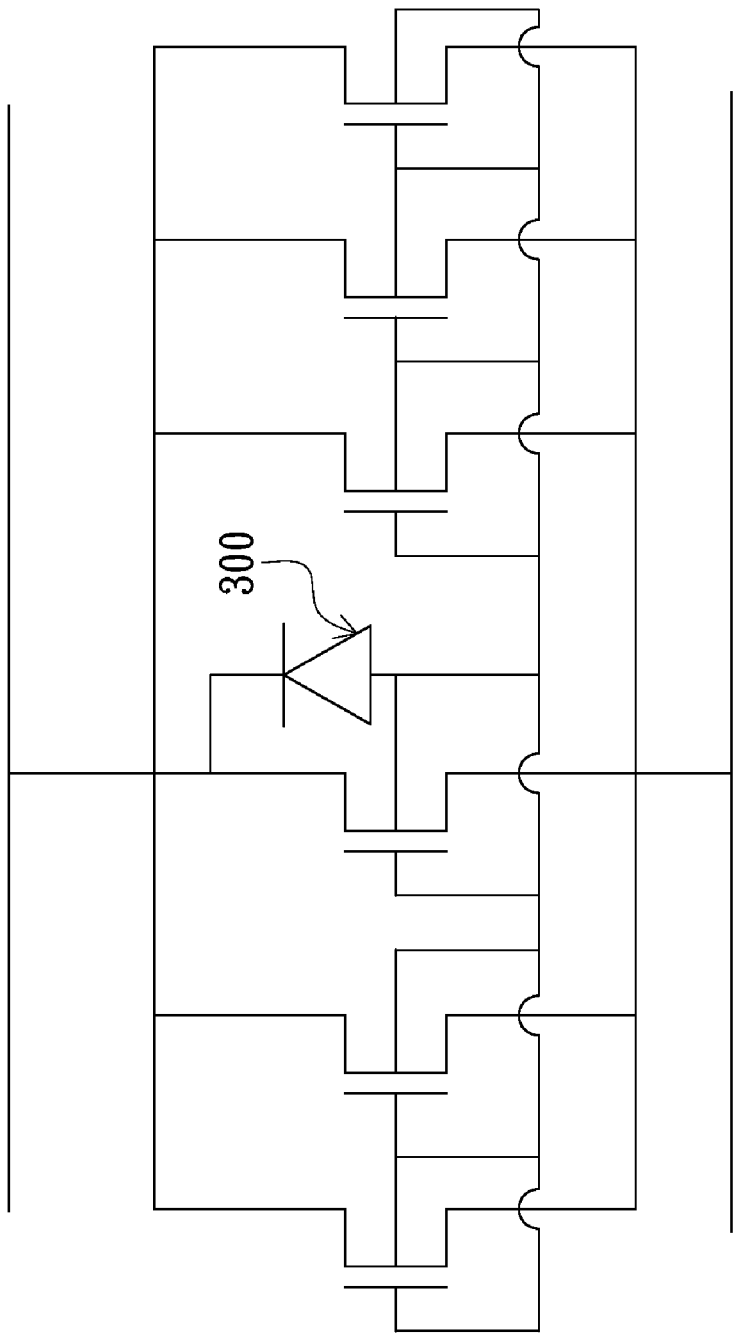
FIG. 3C is an equivalent circuit diagram of the ESD clamping device in FIG. 3.

Referring to FIGS. 3, 3A, 3B and 3C, FIG. 3 showing a partial schematic layout top view of an ESD clamping device in accordance with a third embodiment of the present invention, FIG. 3A showing a schematic cross-sectional view of the ESD clamping device taken along the line A3-A3' in FIG. 3, FIG. 3B showing another schematic cross-sectional view of the ESD clamping device taken along the line B3-B3' in FIG. 3, FIG. 3C showing an equivalent circuit diagram of the ESD clamping device in FIG. 3.

As illustrated in FIGS. 3, 3A and 3B, the ESD clamping device 30 comprises a substrate 31 and a plurality of fingers $F_j$ (j is for example 2i-3, 2i-2, 2i-1, 2i, 2i+1 and 2i+2, where i is a positive integer). In the third embodiment, the substrate 31 is a p-type substrate for the purpose of illustration and comprises a plurality of p-type finger-substrates (not labeled) for the formation of the fingers $F_j$.

In particular, each of the fingers $F_j$ comprises a drain region 33, a source region 35 and a gate 37. The drain region 33 is formed in the p-type finger-substrate, the conductivity type of the drain region 33 is an n-type for the purpose of illustration and generally is a heavily doped $n^+$ region, the drain region 33 further has a plurality of contacts 331 arrayed in rows and formed at a central portion thereof. The source region 35 is formed mutually adjacent with the drain region 33 and in the same p-type finger-substrate with the drain region 33, the conductivity type of the source region 35 is an n-type for the purpose of illustration and generally is a heavily doped $n^+$ region, the source region 35 further has a plurality of contacts 351 arrayed in one row and formed at a central portion thereof. The gate 37 is formed over the p-type finger-substrate and between the drain region 33 and the source region 35, the gate 37 generally is made of poly-silicon and thus also is called as poly-gate, the gate 37 further has a plurality of contacts 371 formed thereon and electrically contacted therewith. As seen from FIG. 3, the drain regions 33 and the source regions 35 of the fingers $F_j$ are arrayed in alternating fashion, the gates 37 of mutually adjacent two of the fingers $F_j$ (e.g., finger pair $F_{2i-3}$, $F_{2i-2}$, or finger pair $F_{2i-1}$, $F_{2i}$) having a common drain region 33 are connected with each other and thereby cooperatively constitute a closed structure, e.g., rectangle structure as illustrated in FIG. 3. Herein, mutually adjacent two of the fingers $F_j$ having a common drain region 33 is called as one finger pair; in another embodiment, mutually adjacent two of the fingers $F_j$ (e.g., $F_{2i-2}$ and $F_{2i-1}$) having a common source region 35 also can be called as one finger pair.

In addition, in one aspect, each of the fingers $F_j$ comprises a gate extension portion 39 projecting from the gate 37 and demarcating an additional region 38 in the drain region 33 of the finger. The gate extension portion 39 generally is made of poly-silicon and constitutes a gate structure cooperatively with the gate 37. The gate structures of adjacent two of the fingers $F_j$ having a common drain region 33 are connected with each other and thereby form a continuous poly-gate structure. The additional region 38 is formed in the finger-substrate to electrically connect therewith and is a heavily doped $p^+$ region for the purpose of illustration. The additional region 38 is surrounded by the gate structure. Furthermore, the additional region 38 has a plurality of contacts 381 formed electrically contacting therewith. Herein, the additional regions 38 of all the fingers $F_j$ are electrically connected to each other and further electrically connected to the gates 37 of all the fingers $F_j$ through a metal layer 36. In another aspect, an ESD implantation region 32 is formed in the finger-substrate and directly underlying a part of rather than an entirety of the common drain region 33 of central fingers $F_{2i-1}$ and $F_{2i}$, herein the central fingers $F_{2i-1}$ and $F_{2i}$ constitute a central finger pair. The ESD implantation is a heavily doped $p^+$ region for the purpose of illustration and thus has an opposite conductivity type with respect to the common drain region 33. As illustrated in FIG. 3, the ESD implantation region 32 is formed directly underlying a central part of the common drain region 33 of the central fingers $F_{2i-1}$ and $F_{2i}$. That is, the ESD implantation region 32 has a dimension smaller than that of the common drain region 33 of the central fingers $F_{2i-1}$ and $F_{2i}$.

In the third embodiment, the common n+ drain region 33 and the two p+ additional regions 38 of the central fingers $F_{2i-1}$ and $F_{2i}$ and the p+ ESD implantation region 32 cooperatively constitute an ESD gated diode 300. It is indicated that when only one of the central fingers $F_{2i-1}$ and $F_{2i}$ have the p+ additional region 38, the ESD gated diode 300 would have only one P+ additional region 38 instead. As illustrated in FIG. 3C, the six nMOS transistors are corresponding to the six fingers $F_j$ in FIG. 3. The drain electrodes of all the nMOS transistors are electrically connected to each other together, the source electrodes of all the nMOS transistors also are electrically connected to each other together. A positive electrode of the ESD gated diode 300 is electrically connected to both the substrates and gates 37 of all the nMOS transistors due to the connection of the metal layer 36, a negative electrode of the ESD gated diode 300 is electrically connected to the drain electrodes of all the nMOS transistors. Herein, since the common n+ drain region 33 and the p+ ESD implantation region 38 generally contribute to most leakage current during a normal operation of the ESD clamping device 30, therefore the minimum ESD implantation region 38 associated with the third embodiment facilitates the achievement of reduced total leakage current during the normal operation. Furthermore, when an ESD event occurs, the ESD gated diode 300 will be turned on at first and then provide some driving current to trigger both the gates 37 and the finger-substrates of all the fingers $F_j$ for ESD protection, so that the turn-on efficiency is increased and thus the robustness of the ESD clamping device 30 is greatly improved.

Fourth Embodiment

Figure 4:
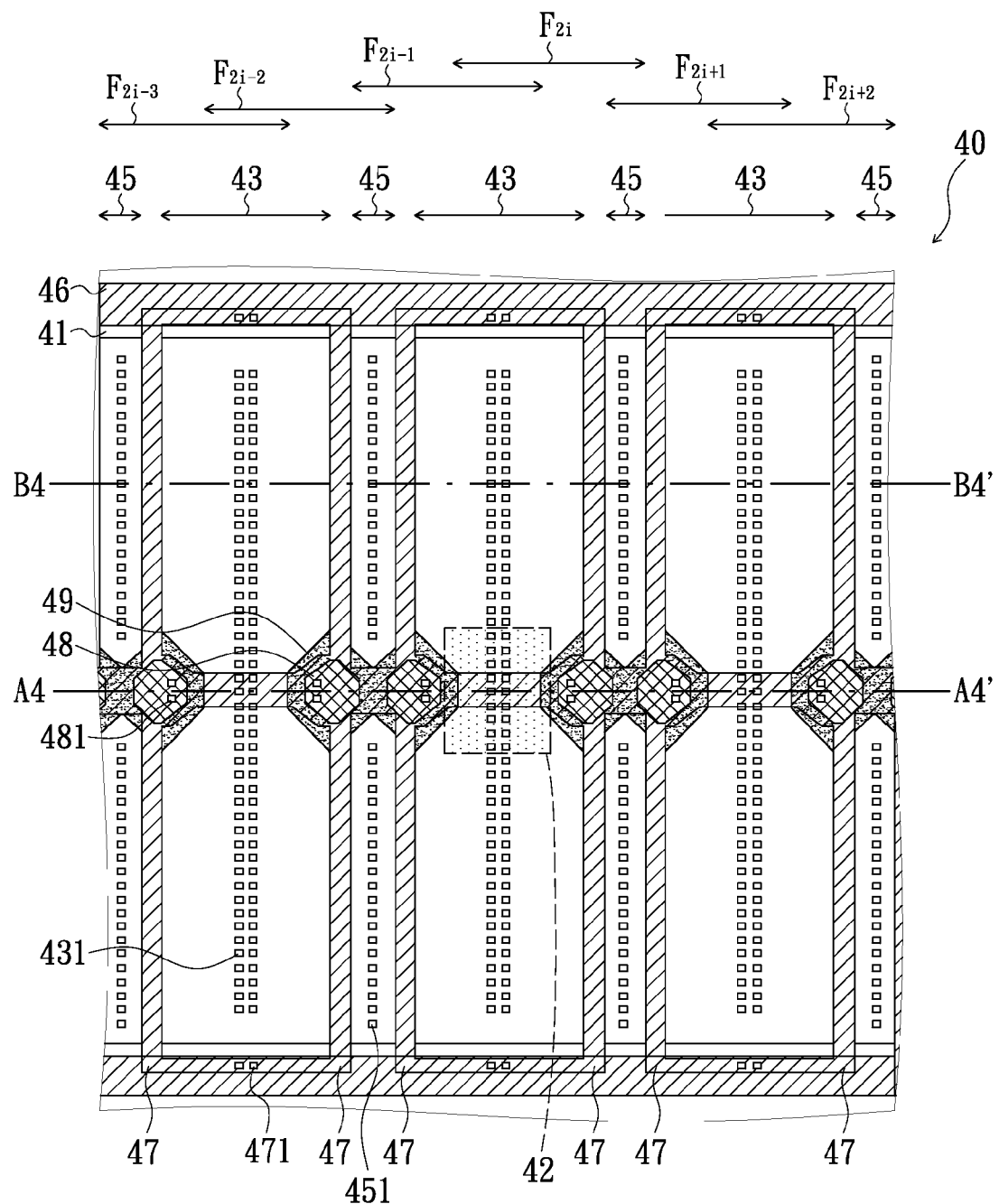
FIG. 4 is a partial schematic layout top view of an ESD clamping device in accordance with a fourth embodiment of the present invention.
Figure 4A:
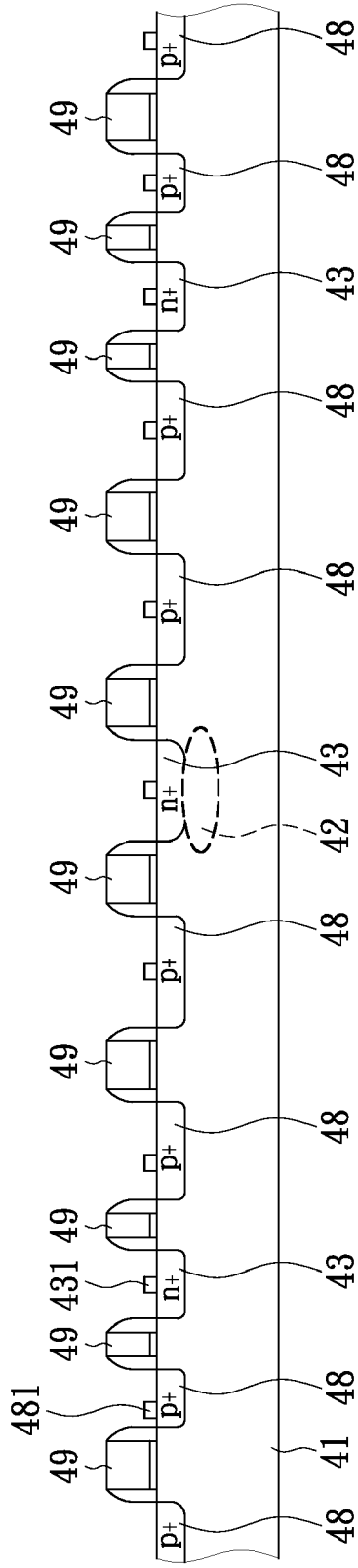
FIG. 4A is a schematic cross-sectional view of the ESD clamping device taken along the line A4-A4' in FIG. 4
Figure 4B:
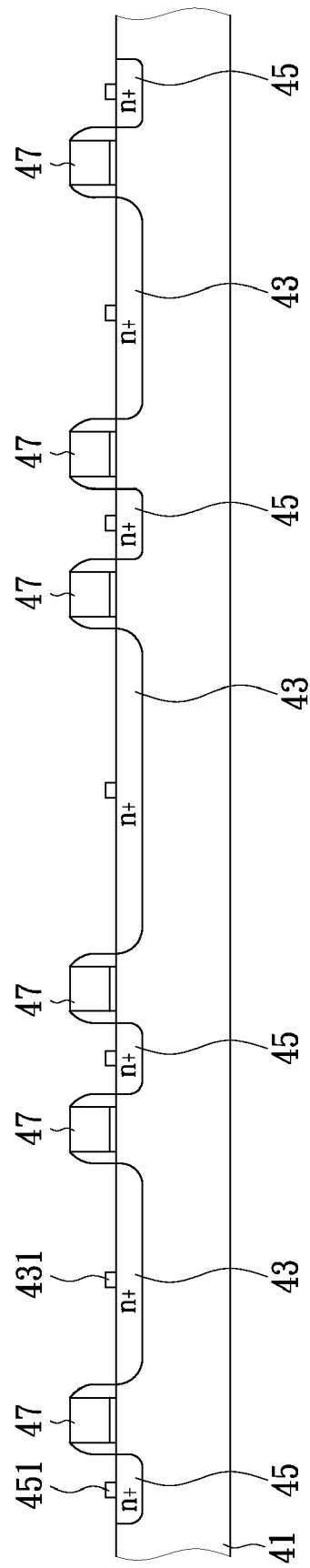
FIG. 4B is a schematic cross-sectional view of the ESD clamping device taken along the line B4-B4' in FIG. 4.

Referring to FIGS. 4, 4A and 4B, FIG. 4 showing a partial schematic layout top view of an ESD clamping device in accordance with a fourth embodiment of the present invention, FIG. 4A showing a schematic cross-sectional view of the ESD clamping device taken along the line A4-A4' in FIG. 3, and FIG. 4B showing another schematic cross-sectional view of the ESD clamping device taken along the line B4-B4' in FIG. 4.

As illustrated in FIGS. 4, 4A and 4B, the ESD clamping device 40 comprises a substrate 41 and a plurality of fingers $F_j$ (j is for example 2i−3, 2i−2, 2i−1, 2i, 2i+1 and 2i+2, where i is a positive integer). In the fourth embodiment, the substrate 41 is a p-type substrate for the purpose of illustration and comprises a plurality of finger-substrates for the formation of the fingers $F_j$.

In particular, each of the fingers $F_j$ comprises a drain region 43, a source region 45 and a gate 47. The drain region 43 is formed in the p-type finger-substrate, the conductivity type of the drain region 43 is an n-type for the purpose of illustration and generally is a heavily doped n+ region, the drain region 43 further has a plurality of contacts 431 arrayed in rows and formed at a central portion thereof. The source region 45 is formed mutually adjacent with the drain region 43 and in the same p-type finger-substrate with the drain region 43, the conductivity type of the source region 45 is an n-type for the purpose of illustration and generally is a heavily doped n+ region, the source region 45 further has a plurality of contacts 451 arrayed in one row and formed at a central portion thereof. The gate 47 is formed over the p-type finger-substrate and between the drain region 43 and the source region 45, the gate 47 generally is made of poly-silicon and thus also is called as poly-gate, the gate 47 further has a plurality of contacts 471 formed thereon and electrically contacted therewith. As seen from FIG. 4, the drain regions 43 and the source regions 45 of the fingers $F_j$ are arrayed in alternating fashion, the gates 47 of mutually adjacent two of the fingers $F_j$ (e.g., finger pair $F_{2i-3}$, $F_{2i-2}$ or finger pair $F_{2i-1}$, $F_{2i}$) having a common drain region 43 are connected with each other and thereby cooperatively constitute a closed structure. Herein, mutually adjacent two of the fingers $F_j$ having a common drain region 43 is called as one finger pair; in another embodiment, mutually adjacent two of the fingers $F_j$ (e.g., $F_{2i-2}$ and $F_{2i-1}$) having a common source region 45 also can be called as one finger pair.

In addition, in one aspect, each of the fingers $F_j$ comprises a gate extension portion 49 projecting from the gate 47 and demarcating an additional region 48 in both the drain region 43 and source region 45 of the finger, and whereby the common source region 45 of mutually adjacent two of fingers $F_j$ (e.g., $F_{2i-2}$ and $F_{2i-1}$) is blocked off by the gate extension portions 49 connected with each other of the adjacent two fingers. The gate extension portion 49 generally is made of poly-silicon and constitutes a gate structure cooperatively with the gate 47, the gate structure of adjacent two of the fingers $F_j$ having a common drain region 43 are connected with each other and thereby form a continuous poly-gate structure. The additional region 48 is formed in the finger-substrate to electrically connect therewith and is a heavily doped p+ region for the purpose of illustration. The additional region 48 is surrounded by the gate structure. Moreover, the additional region 48 has a plurality of contacts 481 formed electrically contacting therewith. Herein, the additional regions 48 of all the fingers $F_j$ are electrically connected to each other and further electrically connected to the gates 47 of all the fingers $F_j$ through a metal layer 46. In another aspect, an ESD implantation region 42 is formed in the finger-substrate and directly underlying a part of rather than an entirety of the common drain region 43 of central fingers $F_{2i-1}$ and $F_{2i}$. The ESD implantation is a heavily doped p+ region for the purpose of illustration and thus has an opposite conductivity type with respect to the common drain region 43. As illustrated in FIG. 4, the ESD implantation region 42 is formed directly underlying a central part of the common drain region 43 of the central fingers $F_{2i-1}$ and $F_{2i}$. That is, the ESD implantation region 42 has a dimension smaller than that of the common drain region 43 of the central fingers $F_{2i-1}$ and $F_{2i}$.

In the fourth embodiment, the common n+ drain region 43 and the two p+ additional regions 48 of the central fingers $F_{2i-1}$ and $F_{2i}$ and the p+ ESD implantation region 42 cooperatively constitute an ESD gated diode similar to the above-mentioned ESD clamping devices 10, 20 and 30 associated with the first through third embodiments respectively. Owing to the use of minimum ESD implantation region 48 associated with the fourth embodiment and the formation of the ESD gated diode, a total leakage current during a normal operation of the ESD clamping device 40 can be minimized, the turn-on efficiency is increased and thus the robustness of the ESD clamping device 40 is greatly improved. Moreover, due to the common source region is blocked off, a driving capability of the ESD gated diode is enhanced.

Fifth Embodiment

Figure 5:
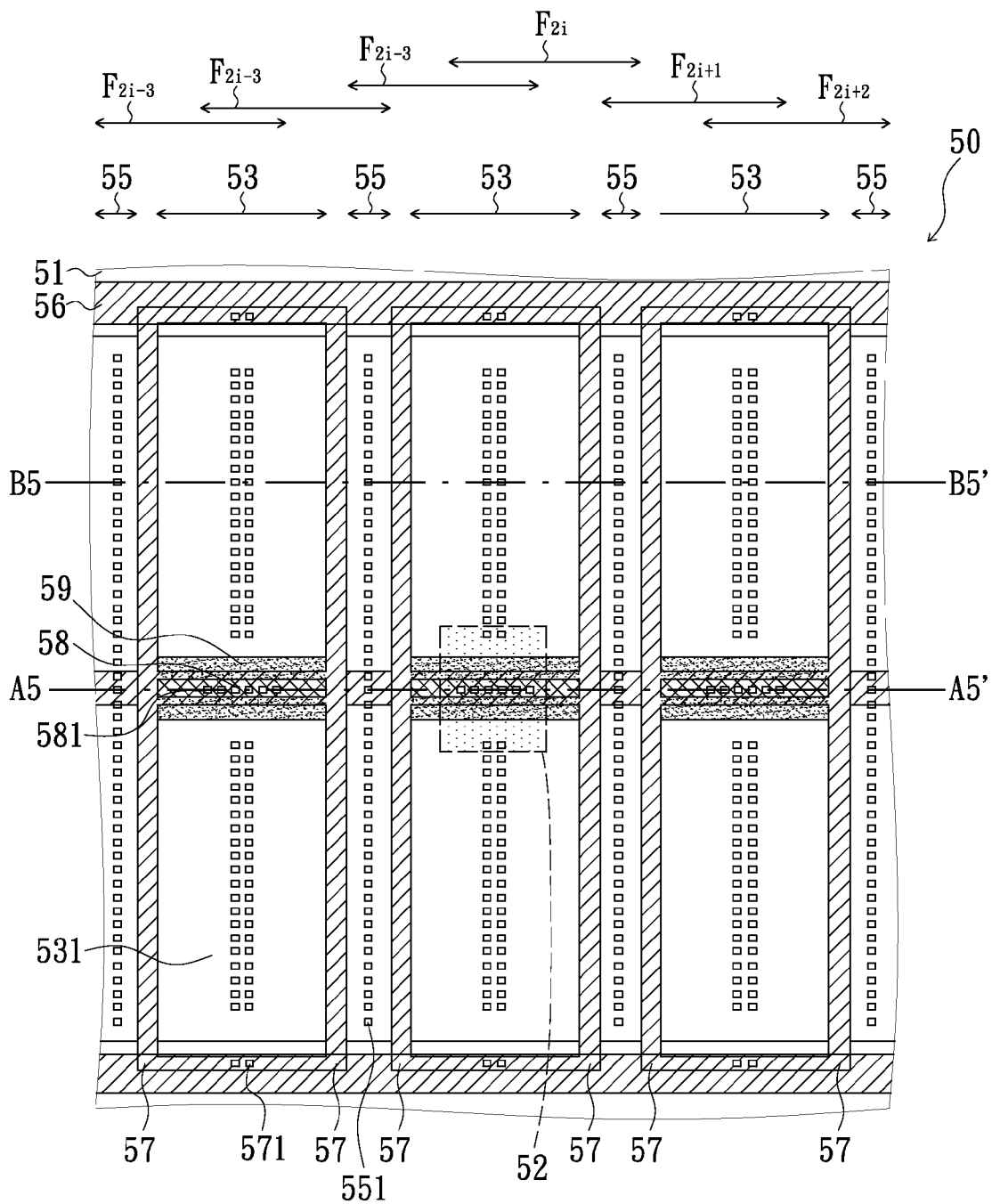
FIG. 5 is a partial schematic layout top view of an ESD clamping device in accordance with a fifth embodiment of the present invention.

Referring to FIGS. 5, 5A and 5B, FIG. 5 showing a partial schematic layout top view of an ESD clamping device in accordance with a fifth embodiment of the present invention, FIG. 5A showing a schematic cross-sectional view of the ESD clamping device taken along the line A5-A5' in FIG. 5, and FIG. 5B showing another schematic cross-sectional view of the ESD clamping device taken along the line B5-B5' in FIG. 5.

As illustrated in FIGS. 5, 5A and 5B, the ESD clamping device 50 comprises a substrate 51 and a plurality of fingers $F_j$ (j is for example 2i−3, 2i−2, 2i−1, 2i, 2i+1 and 2i+2, where i is a positive integer). In the fifth embodiment, the substrate 51 is a p-type substrate for the purpose of illustration and comprises a plurality of finger-substrates (not labeled) for the formation of the fingers $F_j$.

In particular, each of the fingers $F_j$ comprises a drain region 53, a source region 55 and a gate 57. The drain region 53 is formed in the p-type finger-substrate, the conductivity type of the drain region 53 is an n-type for the purpose of illustration and generally is a heavily doped $n^+$ region, the drain region 53 further has a plurality of contacts 531 arrayed in rows and formed at a central portion thereof. The source region 55 is formed mutually adjacent with the drain region 53 and in the same p-type finger-substrate with the drain region 53, the conductivity type of the source region 55 is an n-type for the purpose of illustration and generally is a heavily doped $n^+$ region, the source region 55 further has a plurality of contacts 551 arrayed in one row and formed at a central portion thereof. The gate 57 is formed over the p-type finger-substrate and between the drain region 53 and the source region 55, the gate 57 generally is made of poly-silicon and thus also is called as poly-gate, the gate 57 further has a plurality of contacts 571 formed thereon and electrically contacted therewith. As seen from FIG. 5, the drain regions 53 and the source regions 55 of the fingers $F_j$ are arrayed in alternating fashion, the gates 57 of mutually adjacent two of the fingers $F_j$ (e.g., finger pair $F_{2i-3}$, $F_{2i-2}$, or finger pair $F_{2i-1}$, $F_{2i}$) having a common drain region 53 are connected with each other and thereby cooperatively constitute a closed structure, e.g., rectangle structure as illustrated in FIG. 5, but not to limit the present invention. Herein, mutually adjacent two of the fingers $F_j$ having a common drain region 53 is called as one finger pair; in another embodiment, mutually adjacent two of the fingers $F_j$ (e.g., $F_{2i-2}$ and $F_{2i-1}$) having a common source region 55 also can be called as one finger pair.

In addition, in one aspect, each of the fingers $F_j$ comprises a gate extension portion 59 (e.g., a pair of parallel lines) projecting from the gate 57 and demarcating an additional region 58 in the drain region 53 of the finger, and whereby the common drain region 53 of mutually adjacent two of fingers $F_j$ (e.g., $F_{2i-1}$ and $F_{2i}$) is blocked off by the gate extension portions 59 connected with each other of the adjacent two fingers. The gate extension portion 59 generally is made of poly-silicon and constitutes a gate structure cooperatively with the gate 57, the gate structure of adjacent two of the fingers $F_j$ having a common drain region 53 are connected with each other and thereby form a continuous poly-gate structure. The additional region 58 is formed in the finger-substrate to electrically connect therewith and is a heavily doped $p^+$ region for the purpose of illustration. The additional region 58 further has a plurality of contacts 581 electrically contacting therewith. Herein, the additional regions 58 of all the fingers $F_j$ are electrically connected to each other and further electrically connected to the gates 57 of all the fingers $F_j$ through a metal layer 56. In another aspect, an ESD implantation region 52 is formed in the finger-substrate and directly underlying a part of rather than an entirety of the common drain region 53 of central fingers $F_{2i-1}$ and $F_{2i}$. The ESD implantation is a heavily doped $p^+$ region for the purpose of illustration and thus has an opposite conductivity type with respect to the common drain region 53. As illustrated in FIG. 5, the ESD implantation region 52 is formed directly underlying a central part of the common drain region 53 of the central fingers $F_{2i-1}$ and $F_{2i}$. That is, the ESD implantation region 52 has a dimension smaller than that of the common drain region 53 of the central fingers $F_{2i-1}$ and $F_{2i}$.

In the fifth embodiment, the common $n^+$ drain region 53 and the $p^+$ additional regions 58 connected with each other of the central fingers $F_{2i-1}$ and $F_{2i}$ and the $p^+$ ESD implantation region 52 cooperatively constitute an ESD gated diode similar to the above-mentioned ESD clamping devices 10, 20 and 30 associated with the first through third embodiments respectively. Owing to the use of minimum ESD implantation region 58 associated with the fifth embodiment and the formation of the ESD gated diode, a total leakage current during a normal operation of the ESD clamping device 50 can be minimized, the turn-on efficiency is increased and thus the robustness of the ESD clamping device 50 is greatly improved. Moreover, due to the common drain region is blocked off, a turn-on speed of the ESD gated diode is enhanced.

It is understood that in the above-mentioned first through fifth embodiments of the present invention, the ESD implantation region of each of the ESD clamping devices 10, 20, 30, 40 and 50 is not limited to be formed in the central finger(s), it can be formed in any one of the fingers $F_j$ instead. In another aspect, each of the ESD clamping devices 10, 20, 30, 40 and 50 is not limited to only have one ESD implantation region, and can have a plurality of ESD implantation regions formed partially underlying (i.e., directly underlying a part of rather than an entirety of) the respective drain regions thereof. Additionally, the skilled person in the art can suitably modify the conductivity types of the source and drain regions, the ESD implantation region and the additional regions, the amount of the additional region(s), the shape of the gate extension portions, the position of the gate extension portions, and/or the amount of the gate extension portions associated with each of the first through fifth embodiments as above-mentioned, and so on.

In summary, in the above-mentioned embodiments of the present invention, size-reduced ESD implantation region(s) is/are employed in the ESD clamping device, so that a total leakage current during a normal operation (i.e., generally standby leakage current) of the ESD clamping device can be effectively minimized. Furthermore, due to the configuration of the additional region(s) in one of or all of the fingers and thereby at least one ESD gated diode is formed, the ESD gated diode can be turned on at first during ESD events and then provide some driving current that can be applied for the gates and/or the finger-substrates of the fingers for early triggering on. Accordingly, the present invention proposes an excellent solution for the advantage of low leakage current and/or high turn-on efficiency. Such solution is quite useful for low leakage current applications.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An electro-static discharge (ESD) clamping device, comprising a plurality of fingers and each of the fingers comprising:

a source region of first conductivity type, formed in a substrate of second conductivity type;

a drain region of said first conductivity type, formed in the substrate; and a gate formed over the substrate and between the source and drain regions;

wherein at least one of the fingers each has an ESD implantation region formed in the substrate and partially underlying the drain region of the finger, the ESD implantation region being a heavily doped region of said second conductivity type;

wherein at least one of the fingers each has a gate extension portion projecting from the gate and demarcating an additional region in at least the drain region of the finger, the additional region being a heavily doped region of said second conductivity type and electrically connected to at least one of the gate and the substrate of each of the fingers.

2. The ESD clamping device as claimed in claim 1, wherein the ESD implantation region is formed directly underlying a central part of the drain region.

3. The ESD clamping device as claimed in claim 1, wherein the finger having the ESD implantation region formed in the substrate thereof is a central one of the fingers.

4. The ESD clamping device as claimed in claim 1, wherein gates of adjacent two of the fingers having a common drain region are connected with each other and thereby cooperatively constitute a closed structure.

5. The ESD clamping device as claimed in claim 1, wherein the finger having the additional region is a central one of the fingers.

6. The ESD clamping device as claimed in claim 1, wherein each of the fingers has one the additional region formed in at least the drain region thereof and electrically connected to the substrate thereof, the additional regions of all the fingers being electrically connected with each other.

7. The ESD clamping device as claimed in claim 6, wherein the additional regions of all the fingers are further electrically connected to the gates of all the fingers.

8. The ESD clamping device as claimed in claim 1, wherein gate extension portions of adjacent two of the fingers having a common source region are connected with each other and whereby the common source region is blocked off.

9. The ESD clamping device as claimed in claim 1, wherein gate extension portions of adjacent two of the fingers having a common drain region are connected with each other and whereby the common drain region is blocked off.

10. An electro-static discharge (ESD) clamping device, comprising a plurality of fingers and each of the fingers comprising:

a source region;

a drain region having a same conductivity type with respect to the source region; and a gate structure formed over and between the source and drain regions;

wherein a designated one of the fingers has an ESD implantation region formed directly underlying a part of rather than an entirety of the drain region thereof, the ESD implantation region having an opposite conductivity type with respect to the drain region;

wherein the designated one of the fingers further has an additional region formed between the source and drain regions and surrounded by the gate structure thereof;

wherein the designated one of the fingers each has a gate extension portion projecting from the gate structure, and the additional region being a heavily doped region of said second conductivity type and electrically connected to at least one of the gate structure of each of the fingers.

11. The ESD clamping device as claimed in claim 10, wherein the ESD implantation region is formed directly underlying a central part of the drain region.

12. The ESD clamping device as claimed in claim 10, wherein the designated one of the fingers is a central one of the fingers.

13. The ESD clamping device as claimed in claim 10, wherein each of the fingers has an additional region formed between the source and drain regions and surrounded by the gate structure thereof, and the additional regions of all the fingers are electrically connected with each other.

14. An electro-static discharge (ESD) clamping device, comprising a plurality of finger pairs and each of the finger pairs comprising:

two source/drain regions of first conductivity type formed in a substrate of second conductivity type;

a common drain/source region of said conductivity type formed in the substrate; and a gate structure formed over the substrate and separating the two source/drain regions from the common drain/source region;

wherein a designated one of the finger pairs has an ESD implantation region and an additional region both formed in the substrate, the ESD implantation region being a heavily doped region of said second conductivity type, the additional region being another heavily doped region of said second conductivity type and enclosed by the gate structure;

wherein the designated one of the finger pairs has a gate extension portion projecting from the gate structure, and the additional region is electrically connected to at least one of the gate structure and the substrate of each of the finger pairs.

15. The ESD clamping device as claimed in claim 14, wherein the gate structure of the designated finger pair is a continuous poly-gate structure.

16. The ESD clamping device as claimed in claim 15, wherein the continuous poly-gate structure is a rectangle structure.

17. The ESD clamping device as claimed in claim 14, the designated finger pair is a central one of the finger pairs.

* * * * *